(12) United States Patent
Tomita

(10) Patent No.: US 10,716,205 B2
(45) Date of Patent: Jul. 14, 2020

(54) FLEXIBLE SUBSTRATE

(71) Applicant: Panasonic Intellectual Property Management Co., Ltd., Osaka (JP)

(72) Inventor: Yoshihiro Tomita, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 0 days.

(21) Appl. No.: 14/730,855

(22) Filed: Jun. 4, 2015

(65) Prior Publication Data
US 2015/0382457 A1    Dec. 31, 2015

(30) Foreign Application Priority Data
Jun. 30, 2014  (JP) .................... 2014-134415

(51) Int. Cl.
H05K 1/02    (2006.01)
H05K 1/18    (2006.01)

(52) U.S. Cl.
CPC .......... *H05K 1/0283* (2013.01); *H05K 1/189* (2013.01); *H05K 2201/09281* (2013.01); *H05K 2201/10106* (2013.01)

(58) Field of Classification Search
CPC .. H05K 1/0296; H05K 1/0286; H05K 1/0291; H05K 1/0277; H05K 1/0283; H05K 1/189; H05K 2201/10106; H05K 2201/09281; H01L 23/4985; H01L 23/528
USPC ........................................ 174/255, 254, 257
See application file for complete search history.

(56) References Cited

U.S. PATENT DOCUMENTS

| 2009/0317639 | A1  | 12/2009 | Axisa et al. |
| 2010/0002402 | A1* | 1/2010  | Rogers ................ H01L 21/4867 361/749 |
| 2010/0330338 | A1* | 12/2010 | Boyce .................... B29C 59/02 428/156 |
| 2012/0051005 | A1* | 3/2012  | Vanfleteren ........... H01L 21/565 361/749 |
| 2013/0256921 | A1* | 10/2013 | Huang .................. H01L 23/528 257/786 |

FOREIGN PATENT DOCUMENTS

| JP | 1-135758 U   | 9/1989 |
| JP | 10-256694    | 9/1998 |
| JP | 2000-294886  | 10/2000 |
| JP | 2004-071562  | 3/2004 |

(Continued)

*Primary Examiner* — Steven T Sawyer
(74) *Attorney, Agent, or Firm* — Renner, Otto, Boisselle & Sklar, LLP

(57) ABSTRACT

A flexible substrate includes unit wiring structures including first and second unit wiring structures that are mutually adjacent. Each of the unit wiring structures includes a central section and one or more strips. Each of the one or more strips has first and second ends. The first end is connected to the central section. The second end of at least one of the one or more strips of the first unit wiring structure and the second end of at least one of the one or more strips of the second unit wiring structure are mutually connected. The flexible substrate includes a gap between a side surface of the mutually connected strips and a side surface of the central section of the first or the second unit wiring structure, and/or between a side surface of the mutually connected strips and a side surface of another strip.

13 Claims, 11 Drawing Sheets

(56) References Cited

FOREIGN PATENT DOCUMENTS

| | | |
|---|---|---|
| JP | 2004-119871 | 4/2004 |
| JP | 2004-349002 | 12/2004 |
| JP | 2007-081237 A | 3/2007 |
| JP | 2012-513103 A | 6/2012 |
| JP | 2013-187308 | 9/2013 |
| JP | 2013-187380 A | 9/2013 |
| JP | 2014-072215 A | 4/2014 |
| WO | 2010/081559 A1 | 7/2010 |

\* cited by examiner

EXTENSION (VERTICAL DIRECTION)

(HORIZONTAL DIRECTION)

FLEXIBLE SUBSTRATE

BACKGROUND

1. Technical Field

The present disclosure relates to a flexible substrate.

2. Description of the Related Art

Flexible substrates have often been used in recent years together with the miniaturization and thinning of electronic devices. The use of flexible substrates has been achieved in a variety of fields besides the field of typical electronic devices. For example, the use of flexible substrates has been achieved in wearable devices and the like besides mobile devices such as smartphones.

Wearable devices are required to perform sensing close to the human body or to easily attach to movable parts or joints besides the wrist. The design and the like are therefore considered important, with it being important for the feeling experienced when a wearable device is worn to fit the movement of the user. Consequently, a flexible substrate is required to be provided with sufficient elasticity in addition to flexibility. A flexible substrate configured to be flexible and have an overall serpentine form is known as a conventional technology (Japanese Unexamined Utility Model Registration Application Publication No. 1-135758, Japanese Unexamined Patent Application Publication No. 2000-294886, Japanese Unexamined Patent Application Publication No. 2004-71562, or Japanese Unexamined Patent Application Publication No. 2004-349002).

SUMMARY

One non-limiting and exemplary embodiment provides a flexible substrate that is extensible.

In one general aspect, the techniques disclosed here feature a flexible substrate according to an embodiment of the present disclosure is a flexible substrate including a plurality of unit wiring structures. Each of the plurality of unit wiring structures includes a central section and one or a plurality of strips disposed at the outer side of the central section. Each of the one or plurality of strips has first and second ends, is curved, and is provided with wiring. The first end is connected to the central section. The plurality of unit wiring structures include a first unit wiring structure and a second unit wiring structure that are mutually adjacent. The second end of at least one of the one or plurality of strips of the first unit wiring structure and the second end of at least one of the one or plurality of strips of the second unit wiring structure are mutually connected. The flexible substrate includes a gap between a side surface of the mutually connected strips and a side surface of the central section of the first or the second unit wiring structure, and/or between a side surface of the mutually connected strips and a side surface of another strip. The flexible substrate is extensible in a planar direction and a perpendicular direction of the flexible substrate due to the curvatures of the curves of the mutually connected strips changing.

The flexible substrate of the present disclosure has sufficient elasticity.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

First, an idea at a preliminary step that led to the present inventor conceiving of the flexible substrate according to an embodiment of the present disclosure will be described. The present inventor discovered a problem in that it is possible for a conventional flexible substrate to extend and contract in the longitudinal direction of the flexible substrate but it is difficult for a conventional flexible substrate to extend and contract in a direction that is different from this direction of extension, and despite having flexibility it is difficult to say that a conventional flexible substrate has sufficient elasticity of a degree that responds to market needs. Furthermore, the present inventor discovered a problem in that when a wiring section having a bent form is used, stress is likely to concentrate in the bent section during extension and contraction. The present inverter carried out a diligent investigation in order to solve the aforementioned problems.

The present inventor developed a flexible substrate having a central section and one or a plurality of curved wiring sections (e.g. strips) that are disposed at the outer side of the central section and have one end connected to the central section. The flexible substrate is extensible as a result of the curvature of each curved wiring section changing during extension and contraction, and the flexible substrate therefore has sufficient elasticity.

Figure 10:
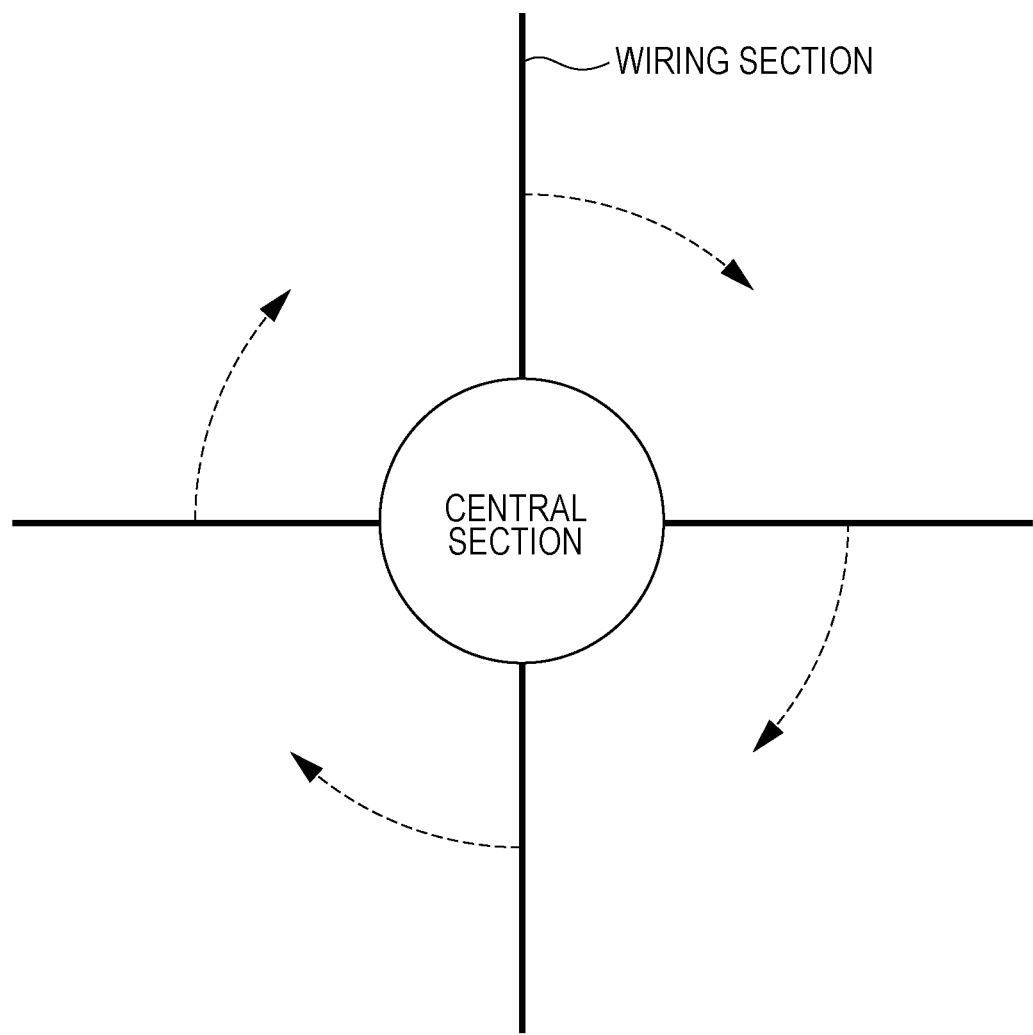
FIG. 10 is a schematic diagram illustrating an idea at a preliminary step that led to the conception of the flexible substrate of the present disclosure.

Furthermore, in order to solve the problem of stress concentrating in part of a wiring section and a breakage becoming likely to occur, the present inventor conceived of using a "curved" wiring section having a relatively large area such that stress is dispersed in the relatively large area, instead of a "bent" wiring section having a relatively small area. The area of the "curved" wiring section is 50% or more of that of the entire wiring section, for example. The area of the "bent" wiring section is less than 50% of that of the entire wiring section, for example. In other words, the present inventor thought that stress can be dispersed without being concentrated in one location by using a curved wiring section that curves in the clockwise direction, for example, around the central section, as depicted in FIG. 10. It is thereby possible to reduce breakages of a flexible substrate even when the flexible substrate repeatedly extends and contracts. The present inventor conceived of the flexible substrate according to an embodiment of the present disclosure on the basis of this idea.

Next, a flexible substrate according to an embodiment of the present disclosure will be described. The various kinds of elements depicted in the drawings are merely illustrated in a schematic manner to aid understanding of the present disclosure, and the dimension ratios and the appearance and the like can be different from the actual elements.

A flexible substrate according to an embodiment of the present disclosure is provided with two or more unit wiring structures. Each unit wiring structure is provided with a central section and one or a plurality of strip-shaped curved wiring sections (strips, in other words) disposed at the outer side of the central section. Each curved wiring section is disposed such that one end is connected to the outer periphery of the central section belonging to the same unit wiring structure and extends along the outer periphery, and the other end is connected to a curved wiring portion of an adjacent unit wiring structure, for example. In the present embodiment, it is sufficient for the curved wiring section to have a wiring section that is at least curved; for example, a flexible substrate of a first embodiment depicted in FIG. 1 and the like is provided with a curved wiring section that is curved approximately 180 degrees along the outer periphery of a central section 3, and a flexible substrate of a second embodiment depicted in FIG. 5 and the like is provided with a curved wiring section disposed so as to encircle the outer periphery of a central section.

In the present specification, with the center of a central section as a reference point, the angle of a portion in which a curved wiring section is disposed curving along the outer periphery of the central section is referred to as a curve central angle. However, this is an exemplification and, in the present disclosure, the curved wiring section may be disposed curving approximately 30 degrees along the outer periphery of the central section, for example, and may be disposed curving approximately 90 degrees along the outer periphery of the central section. It is desirable that the curved wiring section be curved approximately 60 degrees or more along the outer periphery of the central section to increase the strip length of the curved wiring sections arranged between adjacent unit wiring structures. In addition, the curved wiring section may be disposed curving approximately 360 degrees or more along the outer periphery of the central section. In the present specification, the case where the curved wiring section is curved approximately 360 degrees or more along the outer periphery of the central section 3 refers to when the curved central section is disposed wound around the outer periphery of the central section. In the case where the curved wiring section is formed wound around the outer periphery of the central section, it is desirable that the curved wiring section be wound around the outer periphery of the central section approximately one to three times. It should be noted that although the shape of the central section 3 is not particularly limited, it is desirable that it be possible for a polygon shape such as a quadrilateral or a hexagon to be employed besides the aforementioned circular shape, and that, in the case of a polygon shape, the apexes thereof be round-chamfered in accordance with the curve of the curved wiring section.

Figure 3:
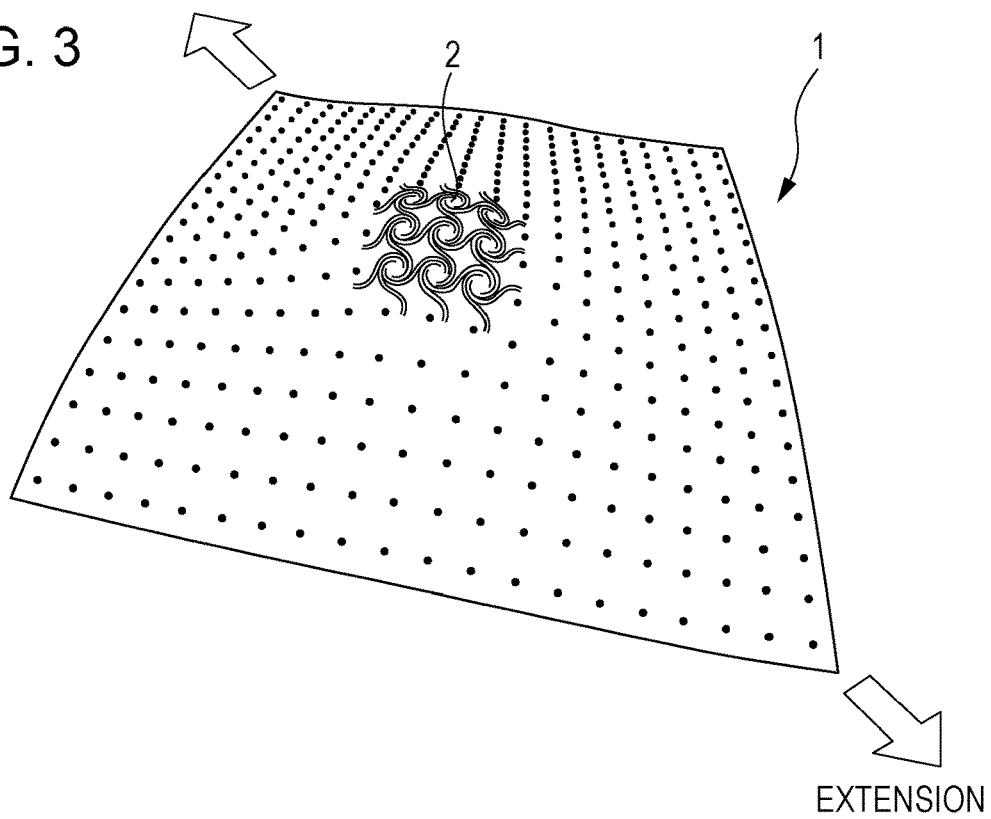
FIG. 3 is a schematic perspective view depicting a state in which the flexible substrate according to the first embodiment of the present disclosure is extended.

Next, a flexible substrate 1 of the present disclosure when extended will be described. Here, a description will be given with reference to FIG. 3, which depicts a state in which the flexible substrate 1 of the first embodiment is extended. As depicted in FIG. 3, when the flexible substrate 1 is extended, the curvature of a curved wiring section 4 disposed along the outer periphery of the central section 3 changes such that the curvature decreases compared with before extension. The "curvature" mentioned in the present specification refers to the inverse of the radius of curvature. In other words, the curved wiring section 4 deforms from one end of the curved wiring section 4 connected to the central section 3 toward the other end of the curved wiring section 4 in such a way as to move away from the outer periphery of the central section 3, the curvature decreases, and the curved wiring section 4 extends. Together with this, for example, in the flexible substrate 1 of the first embodiment, the center of the central section 3 of a unit wiring structure 2 and the center of the curved wiring section 4 of the unit wiring structure 2 become "deviated" from being substantially "aligned" prior to the extension, and the deviation between the centers increases as the flexible substrate 1 is extended. However, the shape of the central section 3 of the unit wiring structure 2 does not deform during the extension, as depicted in FIG. 3. In this way, the curvature of the curved wiring section 4 disposed along the outer periphery of the central section 3 changes and allows the flexible substrate 1 of the present disclosure to extend and contract. Therefore extension and contraction occur with the entirety of the curved wiring section deforming, and stress can be dispersed across the entirety of the curved wiring section. Consequently, in the flexible substrate 1 of the present disclosure, stress is unlikely to become concentrated and the occurrence of a breakage can be suppressed.

Furthermore, in the flexible substrate of the present embodiment, for example, it is possible for the length of the curved wiring section to be increased by increasing the central angle at which curving is implemented along the central section and increasing the number of times that winding is performed, and a greater elasticity can therefore be brought about. To rephrase, it is possible for the initial substrate dimensions before extension and contraction to be made smaller.

First Embodiment

Next, the flexible substrate 1 of the first embodiment of the present disclosure will be described.

Figure 1:
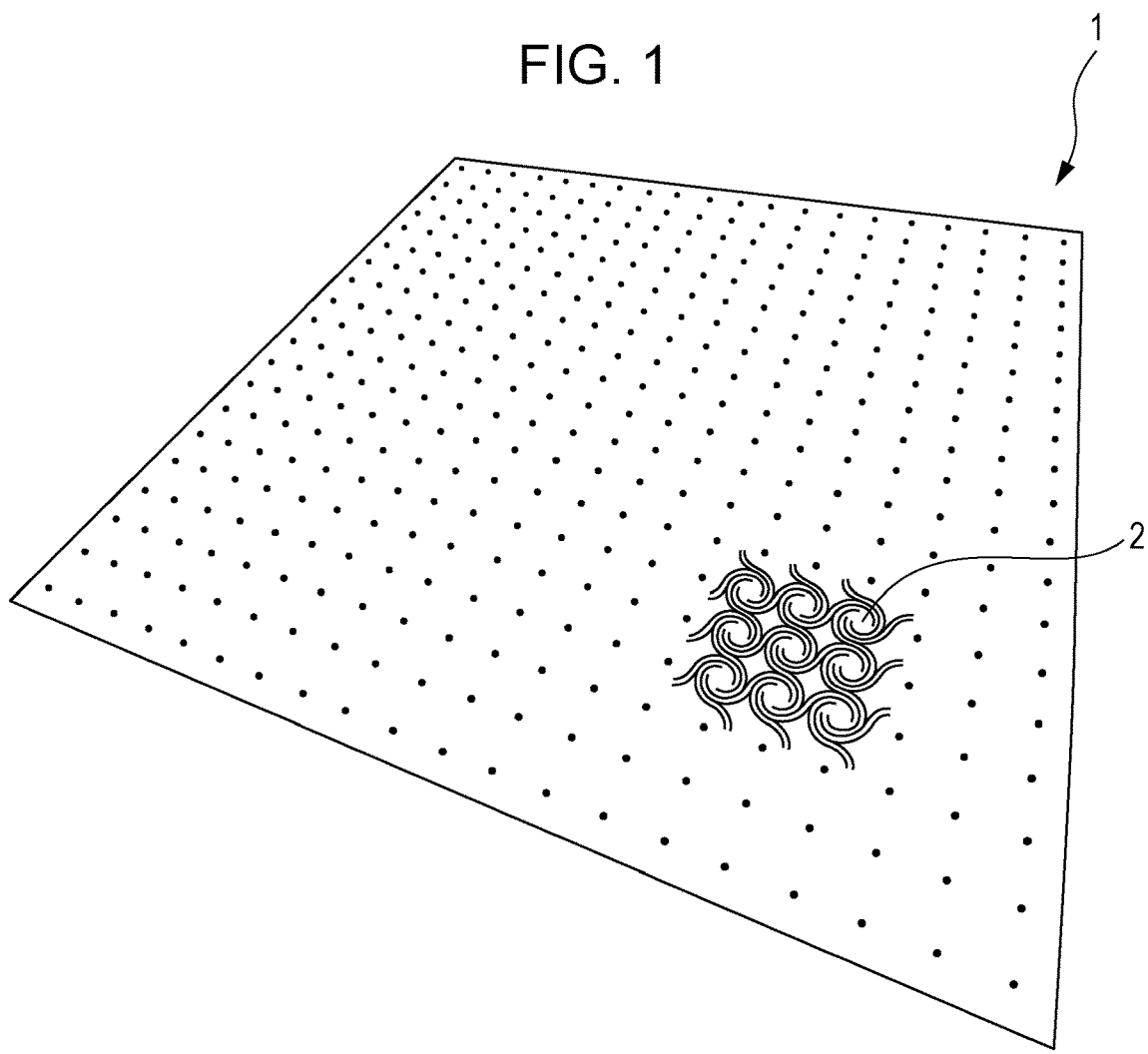
FIG. 1 is a schematic perspective view depicting a flexible substrate according to a first embodiment of the present disclosure.
Figure 2:
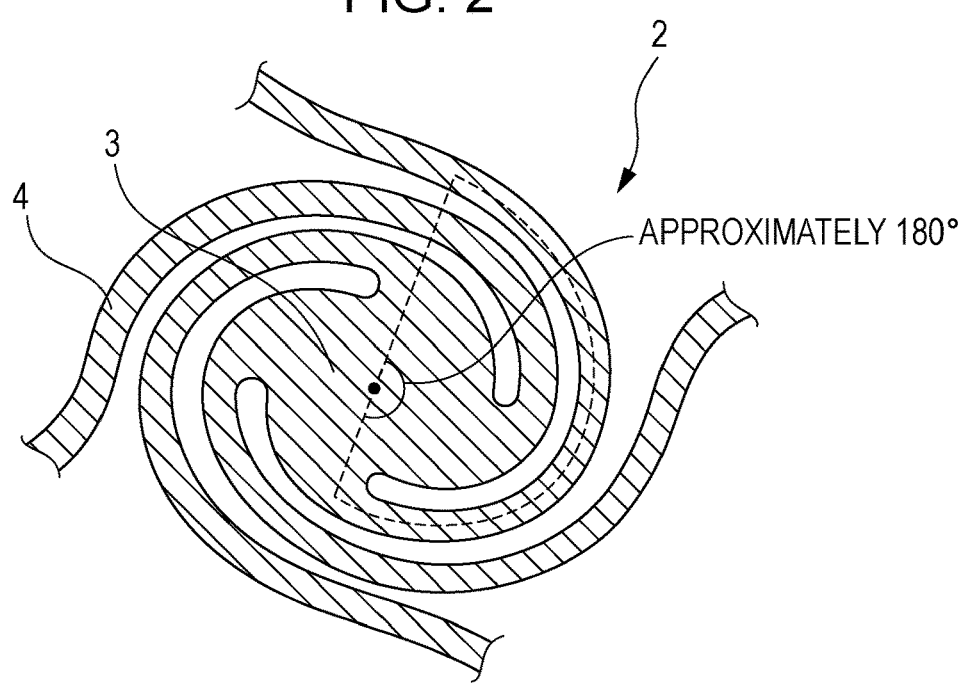
FIG. 2 is a schematic perspective view depicting a unit wiring structure that makes up the flexible substrate according to the first embodiment of the present disclosure.

The flexible substrate 1 of the first embodiment of the present disclosure is provided with a plurality of unit wiring structures 2 arranged in a matrix form as depicted in FIG. 1. In the flexible substrate 1 of the first embodiment of the present disclosure, each unit wiring structure 2 is provided with four curved wiring sections 4 arranged at equal intervals at the outer periphery of a circular central section 3, as depicted in FIG. 2. These curved wiring sections 4 are arranged in a symmetrical manner with respect to the center of the central section 3. Specifically, the four curved wiring sections 4 are arranged at equal intervals at the outer periphery of the central section 3. When the four curved wiring sections 4 are arranged at equal intervals at the outer periphery of the central section 3, there are two lines that correspond to the diameter of the central section 3 and join the ends of mutually opposing curved wiring sections 4, and the two lines are orthogonal.

Figure 4:
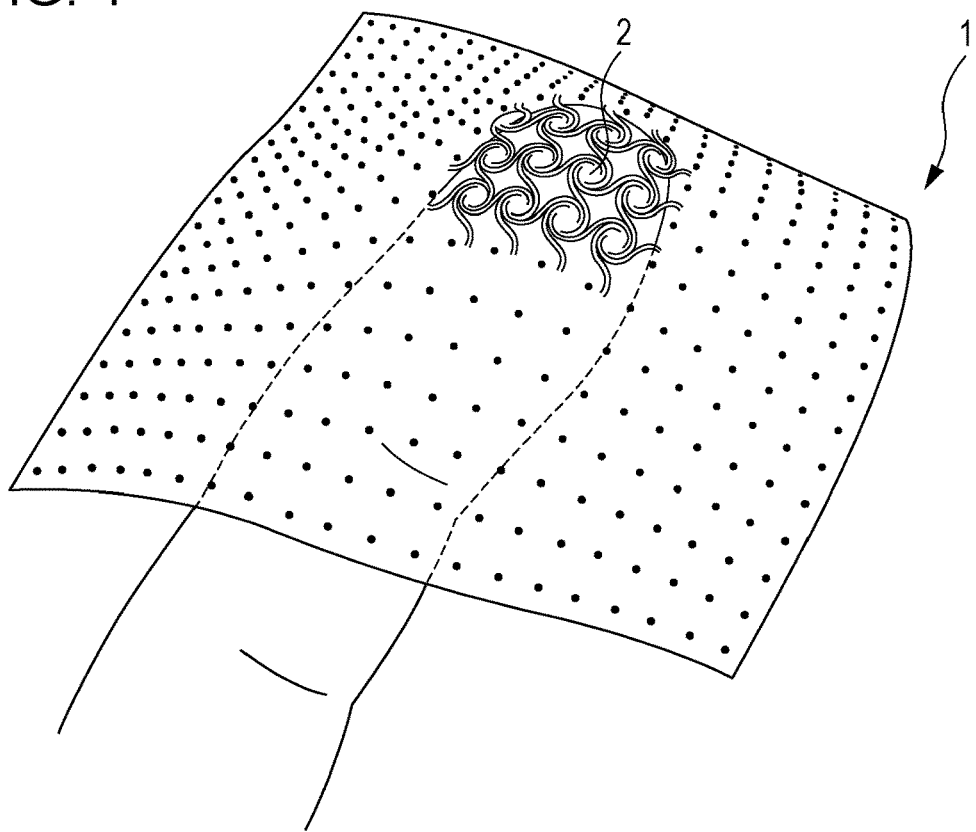
FIG. 4 is a schematic perspective view depicting a state in which the flexible substrate according to the first embodiment of the present disclosure is made to adapt to the shape of a finger of a person.

The unit wiring structures 2 can be disposed side-by-side in one direction, and the unit wiring structures 2 can also be disposed in a direction orthogonal to the one direction. In other words, it is possible for adjacent unit wiring structures 2 to be disposed in the vertical and horizontal directions. Consequently, it becomes possible for the unit wiring structures 2 to be arranged in a matrix form as depicted in FIG. 1. For that reason, the flexible substrate 1 of the first embodiment of the present disclosure can be made to extend and contract not only in one direction but also in an orthogonal direction that is different from the one direction. Consequently, the flexible substrate 1 of the first embodiment of the present disclosure eliminates the problem of the conventional flexible substrate which can extend and contract in the longitudinal direction, but have difficulties to extend and contract in other directions. Consequently, the flexible substrate 1 of the first embodiment of the present disclosure can adapt to complex shapes such as a finger of a person as depicted in FIG. 4. Specifically, it is possible for the flexible substrate 1 to be applied also to wearable devices that are required to perform sensing close to a human body or to easily attach to movable parts or joints besides the wrist.

Second Embodiment

Next, a flexible substrate 10 of a second embodiment of the present disclosure will be described.

Figure 5:
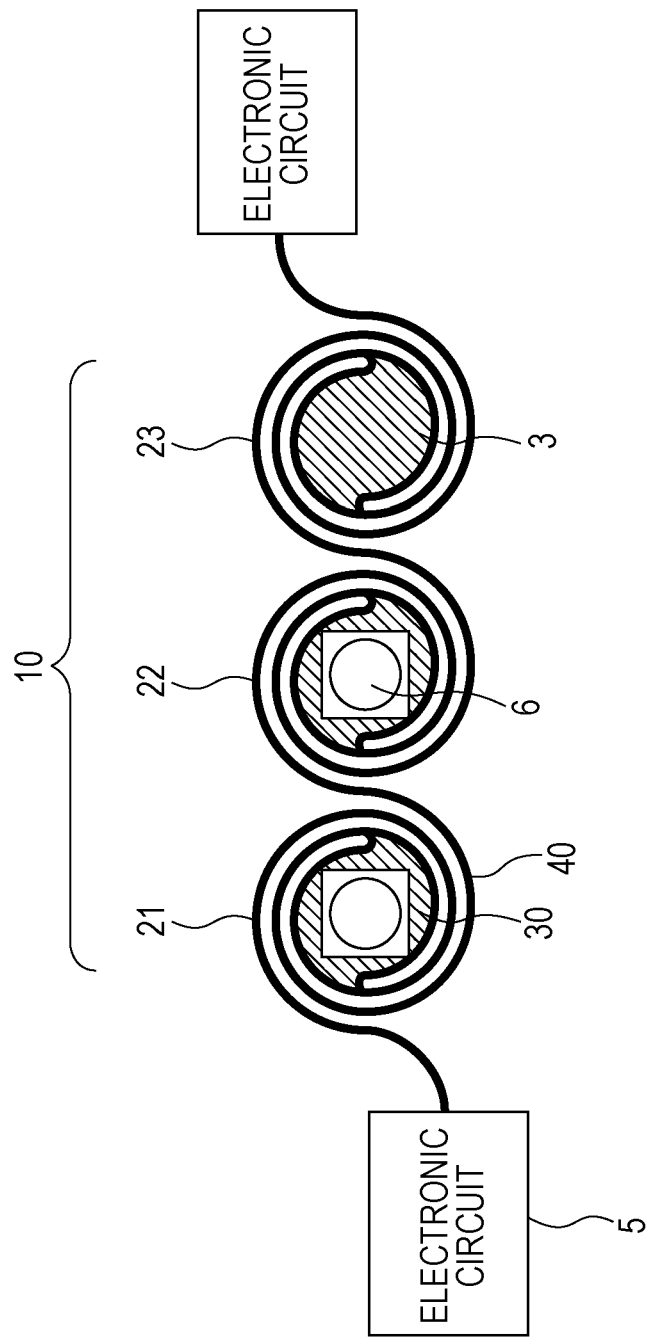
FIG. 5 is a schematic plan view depicting a flexible substrate according to a second embodiment of the present disclosure and an electronic circuit are electrically connected.

The flexible substrate 10 of the second embodiment of the present disclosure is provided with a first unit wiring structure 21, a second unit wiring structure 22, and a third unit wiring structure 23 disposed side-by-side in one direction as depicted in FIG. 5. In the flexible substrate 10 of the second embodiment of the present disclosure, each of the first unit wiring structure 21, the second unit wiring structure 22, and the third unit wiring structure 23 is provided with a central section 30 and two curved wiring sections 40. Each of the two curved wiring sections 40 has one end connected to a central section 30 and is disposed along the outer periphery of the central section 30. When the flexible substrate 10 of the second embodiment of the present disclosure is extended, the curvature of the curved wiring sections 40 disposed along the outer periphery of the central section 30 changes such that the curvature decreases compared with before extension. Together with this, each curved wiring section 40 extends from one end of the curved wiring section 40 connected to the central section 30 toward the other end of the curved wiring section 40 in such a way as to move away from the outer periphery of the central section 30. However, the shapes of the central sections 30 of the first unit wiring structure 21, the second unit wiring structure 22, and the third unit wiring structure 23 do not deform during the extension. Consequently, it becomes possible for the flexible substrate 10 of the second embodiment of the present disclosure to be extended and contracted as a result of only the curvature of the curved wiring sections 40 disposed along the outer periphery of the central sections 30 changing.

Furthermore, in the first unit wiring structure 21 and the second unit wiring structure 22, one curved wiring section 40 of the first unit wiring structure 21 and one curved wiring section 40 of the second unit wiring structure 22 are connected. Electronic elements 6 are disposed on the central sections 30 connected to the one ends of the curved wiring sections 40. Furthermore, in the first unit wiring structure 21, one end of the other curved wiring section 40 is electrically connected to an electronic circuit 5. In the second unit wiring structure 22 and the third unit wiring structure 23, the other curved wiring section 40 of the second unit wiring structure 22 and one curved wiring section 40 of the third unit wiring structure 23 are connected. Furthermore, in the third unit wiring structure 23, one end of the other curved wiring section 40 is electrically connected to an electronic circuit. The electronic circuit 5 and the electronic elements 6 can thereby be electrically connected by way of the highly elastic flexible substrate 10 of the present disclosure, as depicted in FIG. 5. Consequently, it is possible to provide a wearable device or the like that is able to be attached to a site of the human body that extends and contracts to a great extent.

Third Embodiment

Next, a flexible substrate 100' of a third embodiment of the present disclosure will be described.

Figure 6:
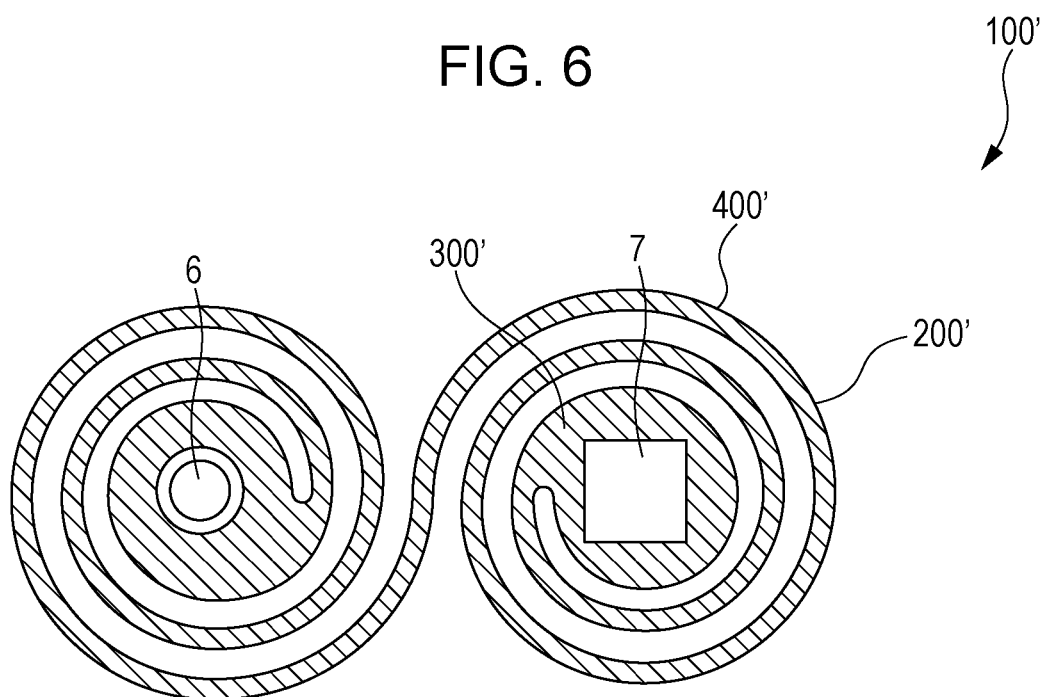
FIG. 6 is a schematic plan view of a flexible substrate according to a third embodiment of the present disclosure, in which each of the unit wiring structures has a single curved wiring section.

FIG. 6 is a schematic plan view of the flexible substrate 100' of the third embodiment of the present disclosure. In the flexible substrate 100', curved wiring sections 400' of unit wiring structures 200' are made up of one curved wiring section. Two unit wiring structures 200' are disposed side-by-side in one direction. One of the unit wiring structures 200' is provided with a central section 300' in which an electronic element 6 is disposed as depicted in FIG. 6, and one curved wiring section 400' disposed at the outer periphery of the central section 300'. The curved wiring section 400' has one end connected to the central section 300' and is disposed along the outer periphery of the central section 300'. Furthermore, the other unit wiring structure 200' is provided with a central section 300' in which a processing circuit 7 is disposed as depicted in FIG. 6, and one curved wiring section 400' disposed at the outer periphery of the central section 300'. The curved wiring section 400' has one end connected to the central section 300' and is disposed along the outer periphery of the central section 300'. Furthermore, the other end of the curved wiring section 400' of the one adjoining unit wiring structure 200' and the other end of the curved wiring section 400' of the other unit wiring structure 200' are connected.

In the flexible substrate 100' of the third embodiment of the present disclosure, for example, when a sensor element is disposed as the electronic element 6 on the central section 300' of the one unit wiring structure 200' and the processing circuit 7 is disposed on the central section 300' of the other unit wiring structure 200', overall it is possible for an attachable sensing system to be provided on a site of the human body that extends and contracts to a great extent.

It should be noted that, in the aforementioned first to third embodiments, an insulation sheet and wiring disposed on both main surfaces of the insulation sheet are provided together with the central sections and the curved wiring sections. In this case, the wiring disposed on both main surfaces of the insulation sheet is electrically connected by way of interlayer connection vias. (In contrast to this, a fourth embodiment described later includes a cross-sectional structure formed mainly from wiring, as well as the central sections and the curved wiring sections.) Furthermore, in the third embodiment, a unit wiring structure may be provided with three curved wiring sections at the outer periphery of a central section, and these curved wiring sections may be arranged in a symmetrical manner with respect to the center of the central section. In other words, it is possible for three adjacent unit wiring structures to be arranged so as to be positioned at the apexes of a triangle. In this case, a unit wiring structure is additionally arranged in an adjacent manner in another direction that intersects the one direction in which two adjacent unit wiring structures are arranged side-by-side, and curved wiring sections are mutually connected between adjacent unit wiring structures.

Fourth Embodiment

Next, a flexible substrate 100 of a fourth embodiment of the present disclosure will be described.

Figure 7:
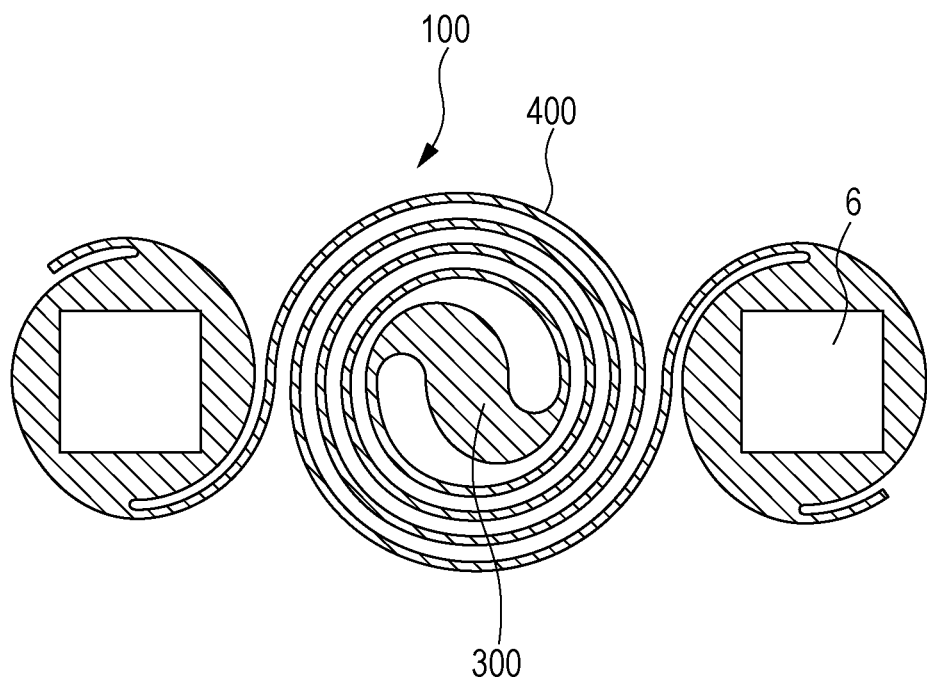
FIG. 7 is a schematic plan view depicting an example in which a flexible substrate according to a fourth embodiment of the present disclosure is used as connection wiring.

FIG. 7 is a schematic plan view depicting an example in which the flexible substrate 100 of the fourth embodiment of the present disclosure is used as connection wiring. As depicted in FIG. 7, at least two electronic elements 6, sensor elements for example, are electrically connected by way of the flexible substrate 100 of the fourth embodiment of the present disclosure. The flexible substrate 100 of the fourth embodiment of the present disclosure is made up of wiring without using an insulation sheet. That is, the flexible substrate 100 of the fourth embodiment of the present disclosure functions as connection wiring. The flexible substrate 100 of the fourth embodiment of the present disclosure is provided with a central section 300 and two curved wiring sections 400. Each of the two curved wiring sections 400 has one end connected to the central section 300 and is disposed along the outer periphery of the central section 300. When the flexible substrate 100 of the fourth embodiment of the present disclosure is to function as connection wiring, the central section 300 does not require a space for providing an electronic element. Therefore, the central section 300 does not have to be circular and may be S-shaped as depicted in FIG. 7, for example. Furthermore, because the flexible substrate 100 of the fourth embodiment of the present disclosure is able to function as connection wiring, the central section 300 and also the curved wiring sections 400 may be structures provided with only wiring without having an insulation sheet.

It is possible for the flexible substrate 100 of the fourth embodiment of the present disclosure to be used between sensor groups that monitor the state of a human body and between processing circuits and the like, for example. It is thereby possible to provide a sensing system that is able to be attached to a site of the human body that extends and contracts to a great extent.

Fifth Embodiment

Next, a flexible substrate 1' of a fifth embodiment of the present disclosure will be described.

Figure 11:
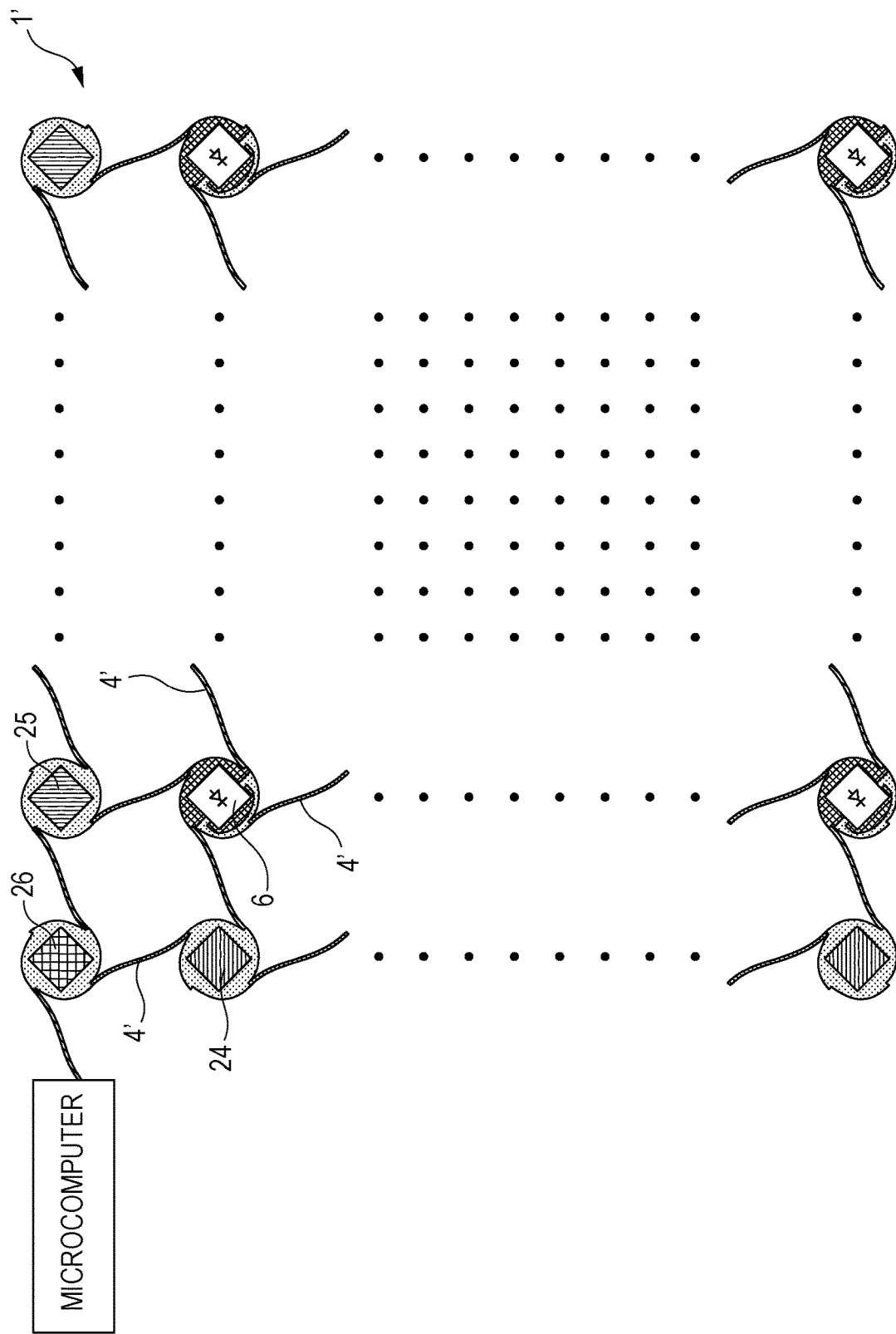
FIG. 11 is a schematic plan view depicting a flexible substrate according to a fifth embodiment of the present disclosure.

FIG. 11 is a schematic plan view depicting the flexible substrate 1' according to the fifth embodiment of the present disclosure. The flexible substrate 1' of the fifth embodiment of the present disclosure is provided with a plurality of unit wiring structures arranged in a matrix form similar to the flexible substrate 1 of the first embodiment of the present disclosure. The unit wiring structures are provided with a plurality of curved wiring sections 4' arranged at equal intervals at the outer periphery of a circular central section. The plurality of curved wiring sections 4' are arranged in a symmetrical manner with respect to the center of the central section. In the fifth embodiment, as depicted in FIG. 11, electronic elements 6 (LED elements, for example), row driver elements 24 for driving the electronic elements 6 arranged in the row direction, column driver elements 25 for driving the electronic elements 6 arranged in the column direction, and a control element 26 electrically connected to the row driver elements 24 and the column driver elements 25 are disposed on the plurality of unit wiring structures arranged in a matrix form.

Figure 12:
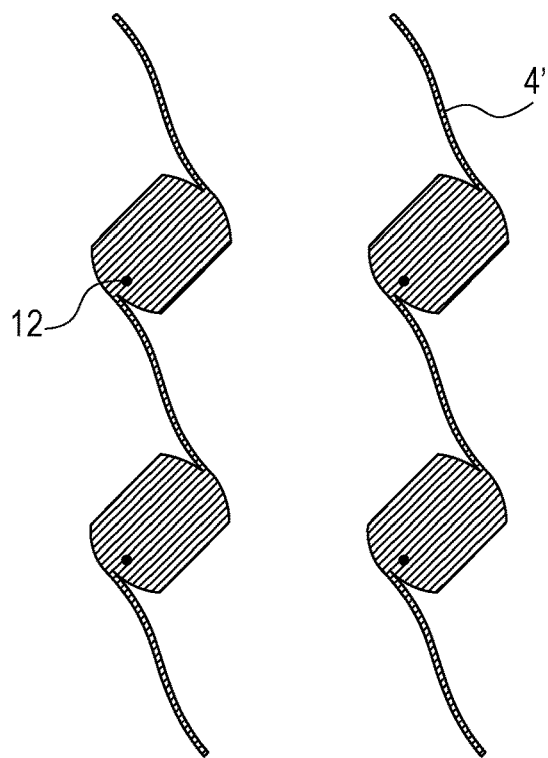
FIG. 12 is a schematic plan view depicting vertical curved wiring sections that make up unit wiring structures on which electronic elements are disposed.
Figure 13:
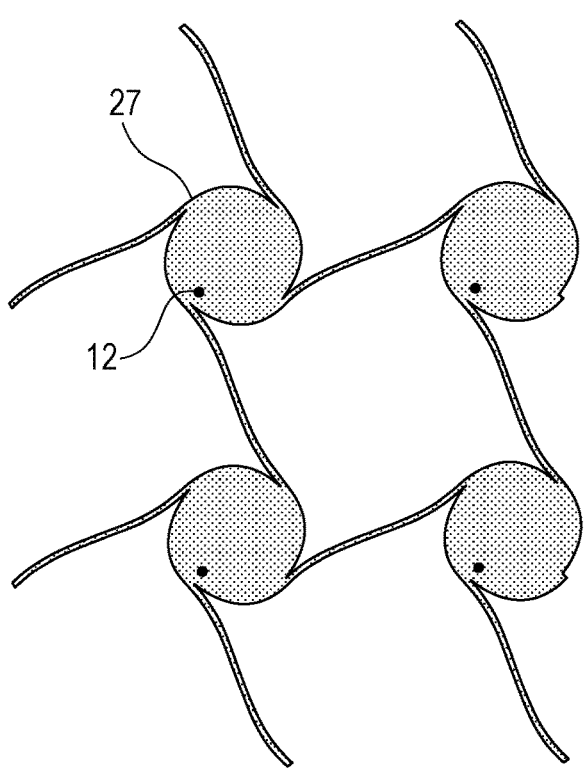
FIG. 13 is a schematic plan view depicting an insulation sheet that makes up unit wiring structures on which electronic elements are disposed.
Figure 14:
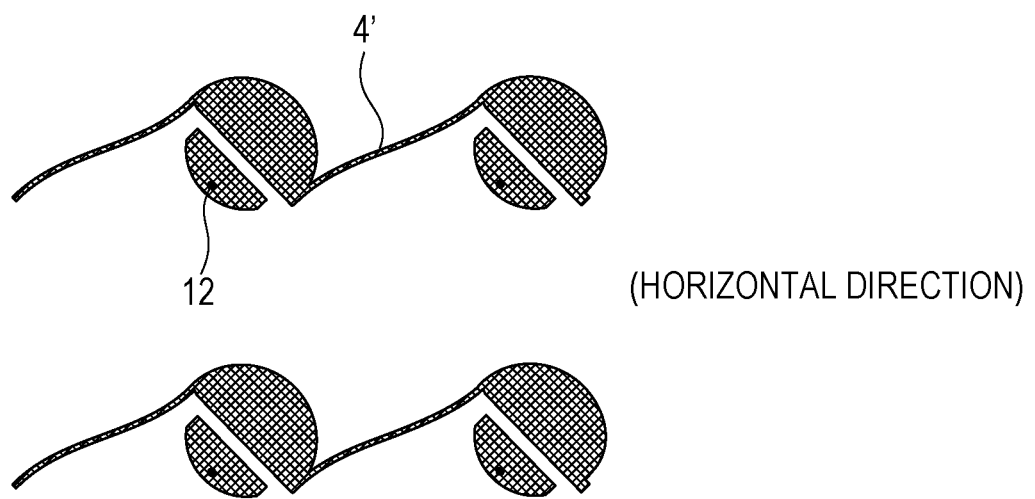
FIG. 14 is a schematic plan view depicting horizontal curved wiring sections that make up unit wiring structures on which electronic elements are disposed.
Figure 15:
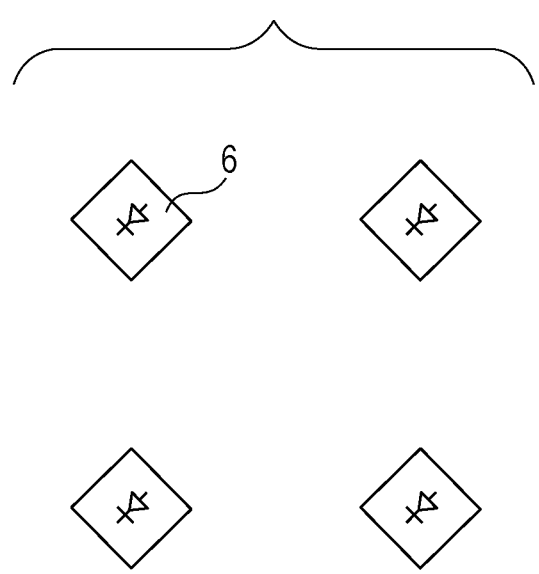
FIG. 15 is a schematic plan view depicting electronic elements that make up wiring structures on which electronic elements are disposed.

Specifically, in the fifth embodiment, as depicted in FIG. 11, the electronic elements 6 disposed on the unit wiring structures are arranged in a matrix form. The unit wiring structures on which these electronic elements 6 are disposed form a structure in which vertical curved wiring sections 4' (see FIG. 12), an insulation sheet 27 (see FIG. 13), horizontal curved wiring sections 4' (see FIG. 14), and the electronic elements 6 (see FIG. 15) are disposed from below in this order. The vertical curved wiring sections 4' and the horizontal curved wiring sections 4' are electrically connected by way of interlayer connection vias 12 that pass through the insulation sheet 27. In the fifth embodiment, from among the unit wiring structures on which the electronic elements 6 are disposed, the unit wiring structures provided with the electronic elements 6 that are disposed side-by-side in an outermost column are electrically connected by way of the curved wiring sections 4' to the respective unit wiring structures provided with the row driver elements 24. In other words, the unit wiring structures provided with the row driver elements 24 are disposed so as to be arranged opposing the unit wiring structures provided with the electronic elements 6 that are disposed side-by-side in the outermost column. Adjacent row driver elements 24 disposed on the unit wiring structures are electrically connected to each other by way of the curved wiring sections 4'.

Here, it is desirable that from among the curved wiring sections 4', the curved wiring sections 4' that electrically connect adjacent row driver elements 24 be made thicker than other curved wiring sections 4' (in other words, the curved wiring sections 4' for electrically connecting the electronic elements 6). It is because the curved wiring sections 4' that electrically connect adjacent row driver elements 24 are impacted from the outside and are caused to electrically conduct more often than the other curved wiring sections 4'. Furthermore, from among the unit wiring structures on which the electronic elements 6 are disposed, the unit wiring structures provided with the electronic elements 6 that are disposed side-by-side in an outermost row are electrically connected by way of the curved wiring sections 4' to the respective unit wiring structures provided with the column driver elements 25. In other words, the unit wiring structures provided with the column driver elements 25 are disposed so as to be arranged opposing the unit wiring structures 2' provided with the electronic elements 6 that are disposed side-by-side in the outermost row. Adjacent column driver elements 25 disposed on the unit wiring structures are electrically connected each other by way of the curved wiring sections 4'. Here, it is desirable that from among the curved wiring sections 4', the curved wiring sections 4' that electrically connect adjacent column driver elements 25 be made thicker than other curved wiring sections 4' (in other words, the curved wiring sections 4' for electrically connecting the electronic elements 6). It is because the curved wiring sections 4' that electrically connect adjacent column driver elements 24 are impacted from the outside and are caused to electrically conduct more often than the other curved wiring sections 4'.

A method for driving the electronic elements 6 is as follows. First, control data is sent from the control element 26 (specifically, from a microcomputer via the control element 26) to each column driver element 25 by way of the curved wiring sections 4', and current that flows in each column direction is controlled in accordance with the control data. Furthermore, control data is sent from the control element 26 to each row driver element 24 by way of the curved wiring sections 4', and current that flows in each row direction is controlled in accordance with the control data. In respective column driver elements 25, sequential data transfer units such as shift registers may be mounted. In this case, the control element 26 may send a control signal to turn on the column driver elements 25, and the sequential data transfer units may sequentially transfer the signal to the column driver elements 25. Thereby, each column can be turned on in sequence. Furthermore, in respective row driver elements 24, sequential data transfer units such as shift registers may be mounted. In this case, the control element 26 may send a control signal to turn on the row driver elements 24, and the sequential data transfer units may sequentially transfer the signal to the row driver elements 24. Thereby, each row can be turned on in sequence. Thus, by using the combination of the row driver elements 24 and the column driver elements 25, the luminance of an electronic element 6 (an LED element, for example) in a prescribed location can be controlled for display. Consequently, in the fifth embodiment, LED elements in which RGB tri-color elements, for example, are mounted can be used to control a full-color display.

In the fifth embodiment, the electronic elements 6, the row driver elements 24, the column driver elements 25, and the control element 26 are disposed on the unit wiring structures that are provided with the plurality of curved wiring sections 4' arranged at equal intervals at the outer periphery of circular central sections as described above. Thus, the concentration of stress and the occurrence of breakages can be suppressed and the elasticity of the flexible substrate 1' can be ensured. Moreover, it is also possible to cause a desired electronic element 6 to be driven.

In the first to fifth embodiments, one end of a curved wiring section of a unit wiring structure is connected to a central section whereas the other end of the curved wiring section of the unit wiring structure is connected to a curved wiring unit of an adjacent unit wiring structure. The connection point where the other end of a curved wiring section of one unit wiring structure and the other end of a curved wiring section of another unit wiring structure are connected is an "inflection point". An inflection point is a point where concavity and convexity change on a curve, in other words, a point where a curve switches from being convex from below to being convex from above, or a point where a curve switches from being convex from above to being convex from below. However, in the flexible substrate of the present disclosure, a connection point where the other end of a curved wiring section of one unit wiring structure and the other end of a curved wiring section of another unit wiring structure are connected does not necessarily have to be an "inflection point". For example, it is possible for the following aspect to also be adopted.

Sixth Embodiment

Next, a flexible substrate 10' of a sixth embodiment of the present disclosure will be described.

Figure 16:
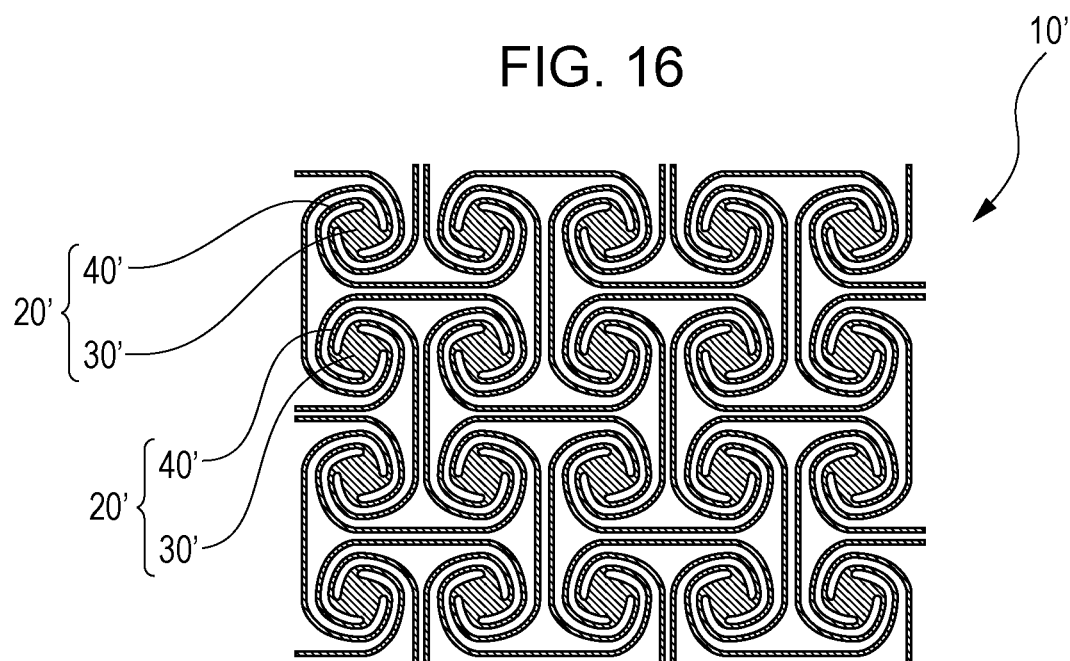
FIG. 16 is a schematic plan view depicting a flexible substrate according to a sixth embodiment of the present disclosure.

FIG. 16 is a schematic plan view depicting the flexible substrate 10' according to the sixth embodiment of the present disclosure. The flexible substrate 10' of the sixth embodiment of the present disclosure is provided with a plurality of unit wiring structures 20' arranged in a matrix form as depicted in FIG. 16. The flexible substrate 10' of the sixth embodiment of the present disclosure is different from the first to fifth embodiments in not having inflection points at connection points where the other end of a curved wiring section 40' of one unit wiring structure 20' and the other end of a curved wiring section 40' of another unit wiring structure 20' are connected. In the flexible substrate 10' of the sixth embodiment of the present disclosure, a unit wiring structure 20' is provided with four curved wiring sections 40' arranged at equal intervals at the outer periphery of a circular central section 30', as depicted in FIG. 16. These curved wiring sections 40' are arranged in a symmetrical manner with respect to the center of the central section 30'.

Seventh Embodiment

Next, a flexible substrate 10" of a seventh embodiment of the present disclosure will be described.

Figure 17:
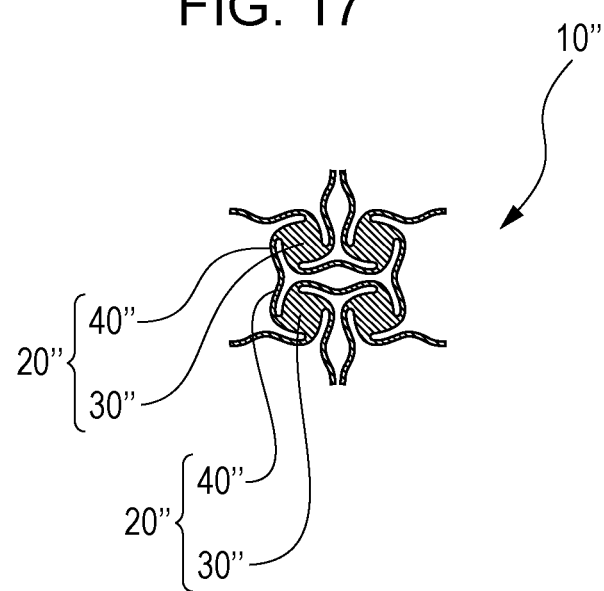
FIG. 17 is a schematic plan view depicting a flexible substrate according to a seventh embodiment of the present disclosure.

FIG. 17 is a schematic plan view depicting the flexible substrate 10" according to the seventh embodiment of the present disclosure. The flexible substrate 10" of the seventh embodiment of the present disclosure is similar to the sixth embodiment and different from the first to fifth embodiments in not having inflection points at connection points where the other end of a curved wiring section 40" of one unit wiring structure 20" and the other end of a curved wiring section 40" of another unit wiring structure 20" are connected. The flexible substrate 10" according to the seventh embodiment of the present disclosure is provided with a plurality of unit wiring structures 20". The unit wiring structures 20" are provided with four curved wiring sections 40" arranged at equal intervals at the outer periphery of a circular central section 30" as depicted in FIG. 17. These curved wiring sections 40" are arranged in a symmetrical manner with respect to the center of the central section 30".

In the sixth and seventh embodiments, as in the first to fifth embodiments, when the flexible substrate is extended, the curvatures of the curved wiring sections disposed along the outer periphery of the central section change such that the curvatures decrease compared with before extension. However, the shapes of the central sections of the unit wiring structures do not deform during the extension. In this way, in the flexible substrates of the sixth and seventh embodiments of the present disclosure, the curvatures of the curved wiring sections disposed along the outer periphery of the central sections change and allow the flexible substrates to extend and contract, and therefore extension and contraction occurs with the entirety of the curved wiring sections deforming, and stress can be dispersed across the entirety of the curved wiring sections. Consequently, stress is unlikely to become concentrated and the occurrence of a breakage can be suppressed also in the flexible substrates of the sixth and seventh embodiments of the present disclosure.

Here, the materials of the insulation sheet and wiring used in the aforementioned embodiments will be discussed. It is desirable that the insulation sheet be formed from at least one kind of material selected from the group consisting of polyethylene terephthalate (PET), polyethylene naphthalate (PEN), polyether ether ketone (PEEK), polyimide (PI), and a liquid crystal polymer and the like, for example. The wiring is not particularly limited as long as the wiring exhibits conductivity. Possible examples of materials for a conductor layer used in the aforementioned embodiments area metal material such as gold (Au), silver (Ag), copper (Cu), nickel (Ni), chromium (Cr), cobalt (Co), magnesium (Mg), calcium (Ca), platinum (Pt), molybdenum (Mo), iron (Fe) and/or zinc (Zn), or a conductive oxide material such as zinc oxide (ZnO), tin oxide ($SnO_2$), indium tin oxide (ITO), fluorine-containing tin oxide (FTO), ruthenium oxide ($RuO_2$), iridium oxide ($IrO_2$) and/or platinum oxide ($PtO_2$), and, in addition, a conductive polymer material such as a polythiophene-based and/or a polyaniline-based material. It should be noted that when the wiring is disposed on insulation sheet, coating processing or sealing processing may be carried out with an insulative material.

Furthermore, the "electronic element" is not particularly limited and possible examples include a semiconductor element, a temperature sensor, a pressure sensor, and an actuator and the like. A semiconductor element mentioned here essentially refers to a light emitting element, a light receiving element, a diode, and a transistor and the like. Other specific examples of an electronic element that can be given include an IC (a control IC, for example), an inductor, a capacitor, a power element, a chip resistance, a chip capacitor, a chip varistor, a chip thermistor, another chip-shaped laminated filter, and a connection terminal and the like.

[Method for Manufacturing Flexible Substrate of the Present Disclosure]

Next, a method for manufacturing a flexible substrate according to an embodiment of the present disclosure will be described.

First Embodiment (Aspect in which Wiring is Disposed on Both Main Surfaces of Insulative Sheet)

(Preparation of Insulation Sheet+Forming Metal Foil on Insulation Sheet)

Figure 8A:
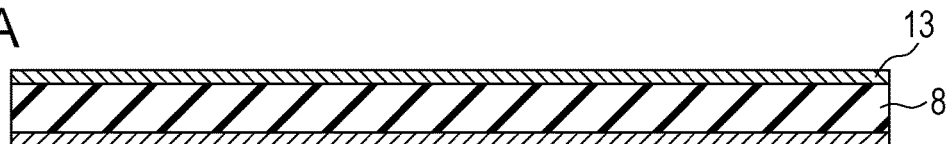
FIGS. 8A to 8G show steps of a method for manufacturing the flexible substrate of the first embodiment of the present disclosure.

First, as depicted in FIG. 8A, an insulation sheet 8 is prepared and a metal foil 13 (thickness 5 to 50 µm) is formed on both main surfaces of the insulation sheet 8. At least one from the group consisting of polyethylene terephthalate (PET), polyethylene naphthalate (PEN), polyether ether ketone (PEEK), polyimide (PI), and a liquid crystal polymer and the like can be selected as the insulation sheet 8. In the present embodiment, it is desirable that an insulation sheet 8 formed from polyimide that has flexibility/bendability be used. The metal foil 13 is not particularly limited to a particular material and a copper foil can be used, for example.

It should be noted that although the metal foil 13 is formed on both main surfaces of the insulation sheet 8 in the present embodiment, the present disclosure is not limited thereto and the metal foil 13 may be formed on one main surface of the insulation sheet 8.

(Pattern Forming)

Figure 8B:
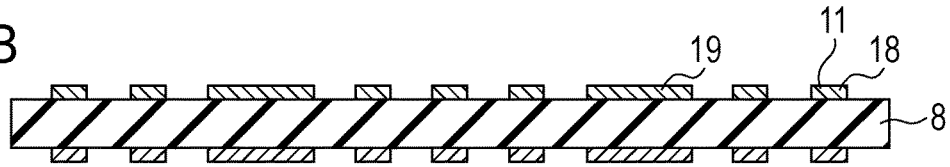

Next, as depicted in FIG. 8B, desired locations of the metal foil 13 formed on both main surfaces of the insulation sheet 8 are etched to form prescribed wiring patterns 11. Specifically, wiring patterns 11 made up of central section precursors 19 and curved wiring section precursors 18 that have one end connected to a central section precursor 19 and are disposed along the outer periphery of a central section precursor 19 are formed.

(Forming Interlayer Connection Vias)

Figure 8C:
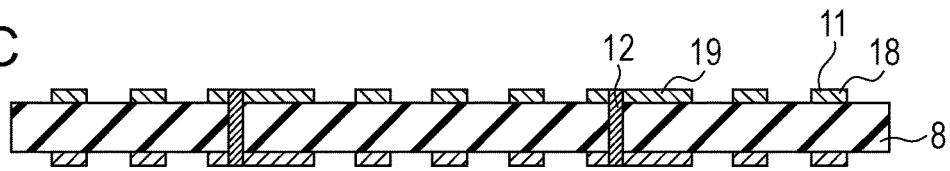

Next, through holes that pass from the wiring patterns 11 formed on one main surface of the insulation sheet 8, through the insulation sheet 8, to the wiring patterns 11 formed on the other main surface of the insulation sheet 8 are formed in regions in which electronic elements 6 and the like described hereinafter are to be placed. Next, as depicted in FIG. 8C, plating processing, for example, is carried out on the through holes to form interlayer connection vias 12.

(Forming Wiring Protection Sheets)

Figure 8D:
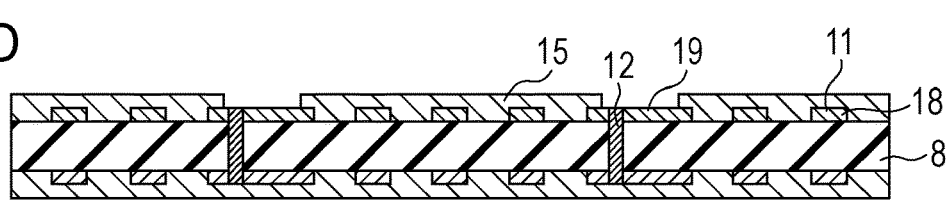

Next, as depicted in FIG. 8D, wiring protection sheets 15 are disposed so as to cover the wiring patterns 11 except in regions in which the electronic elements 6 and the like described hereinafter are to be placed.

(Placing Electronic Elements)

Figure 8E:
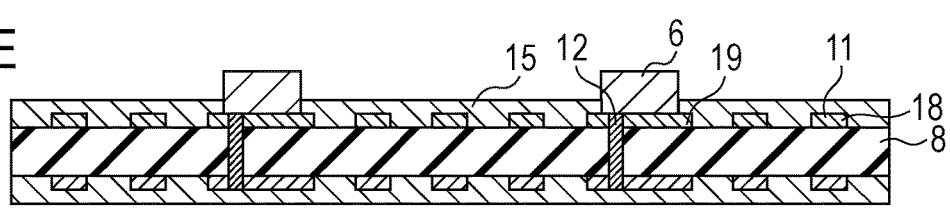

Next, as depicted in FIG. 8E, the electronic elements 6 are disposed on the exposed wiring patterns 11.

(Laser Cutting)

Figure 8F:
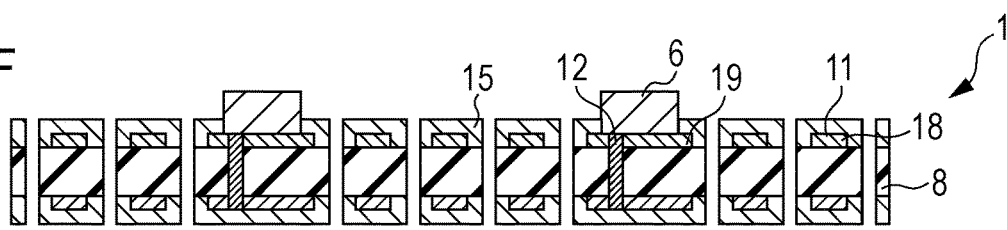
Figure 8G:
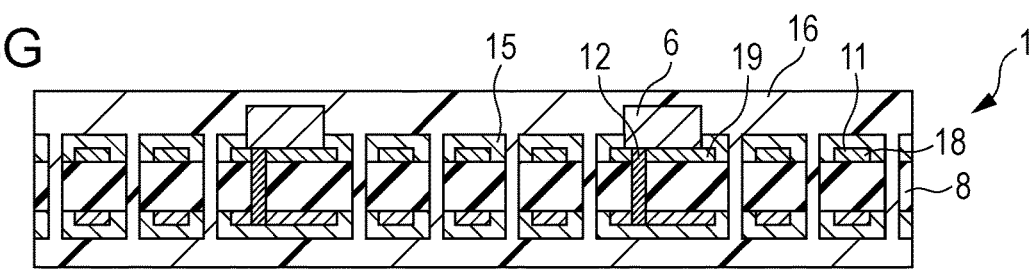

Next, as depicted in FIG. 8F, prescribed locations of the wiring protection sheet 15 and the insulation sheet 8 are cut away by laser cutting. The prescribed locations of the wiring protection sheet 15 and the insulation sheet 8 are between the wiring patterns 11 when viewed from a direction perpendicular to the main surface of the insulation sheet 8. Central sections 3 and curved wiring sections 4 that have one end connected to a central section 3 and are disposed along the outer periphery of a central section 3 are thereby formed. According to the above, the flexible substrate 1 of the present disclosure can be formed. As depicted in FIG. 8F, each curved wiring section (a strip, in other words) 4 has a gap between a side surface thereof and a side surface of a central section 3, and between a side surface thereof and a side surface of another curved wiring section 4. As a result of having these gaps, the degree of freedom for the change in curvature of each curved wiring section increases, and the flexible substrate 1 is extensible in the planar direction and perpendicular direction thereof.

(Coating Flexible Member)

In addition, as depicted in FIG. 3G, the entirety of the flexible substrate of the present disclosure may be covered by a flexible member 16 such as an elastomer.

It should be noted that, in order to ensure the elasticity of the flexible substrate 1 of the present disclosure, it is desirable that the thickness of the flexible member 16 such as an elastomer that is disposed in gap portions between the curved wiring sections 4 be less than the thickness of the flexible member 16 such as an elastomer that is disposed on the curved wiring sections 4. It should be noted that a precursor solution for the flexible member 16 may be spray coated on the flexible substrate 1 of the present disclosure. Furthermore, the concentration of a precursor solution for the flexible member 16 that it is applied in the gap portions between the curved wiring sections 4 and the concentration of a precursor solution for the flexible member 16 that is applied on the curved wiring sections 4 may be adjusted in advance, and then the precursor solutions may be applied to the gap portions and the curved wiring sections 4.

Second Embodiment (Aspect in which Wiring is Disposed on One Main Surface of an Insulation Sheet)

(Forming of Metal Foil)

Figure 9A:
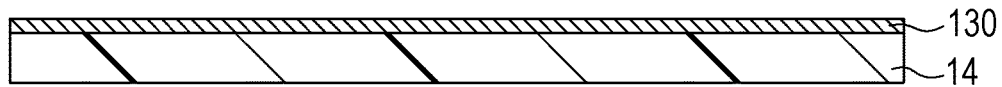
FIGS. 9A to 9F show steps of a method for manufacturing the flexible substrate of the second embodiment of the present disclosure.

First, as depicted in FIG. 9A, a metal foil 130 is affixed to one main surface of a temporarily fixed sheet 14 (thickness 5 to 50 μm). The metal foil 130 is not particularly limited to a particular material and a copper foil can be used, for example.

(Pattern Forming)

Figure 9B:
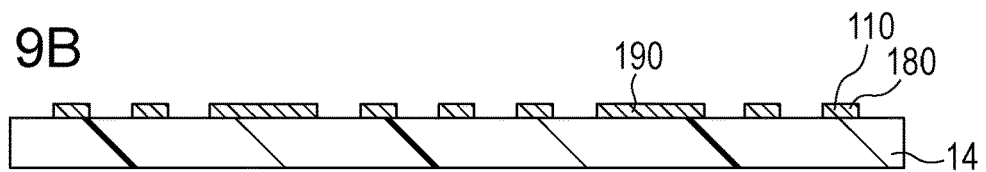

Next, as depicted in FIG. 9B, desired locations of the metal foil 130 affixed to the one main surface of the temporarily fixed sheet 14 are etched to form prescribed wiring patterns 110. Specifically, wiring patterns 110 made up of central section precursors 190 and curved wiring section precursors 180 that have one end connected to a central section precursor 190 and are disposed along the outer periphery of a central section precursor 190 are formed.

(Placing Electronic Elements)

Figure 9C:
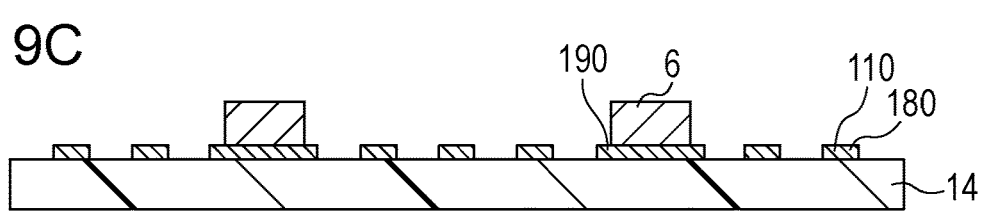

Next, as depicted in FIG. 9C, electronic elements 6 are disposed on the wiring patterns 110. In this case, the electronic elements 6 are disposed in portions corresponding to central sections of the flexible substrate of the present disclosure that will be ultimately obtained.

(Coating Flexible Member)

Figure 9D:
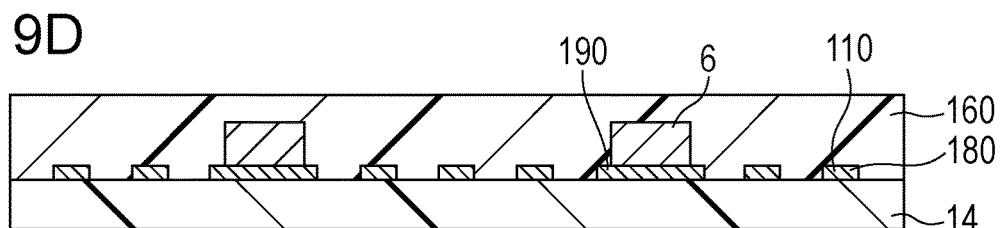

Next, as depicted in FIG. 9D, the wiring patterns 110 and the electronic elements 6 disposed on the wiring patterns 110 are covered with a flexible member. 160 such as an elastomer.

(Detaching Temporarily Fixed Sheet)

Figure 9E:
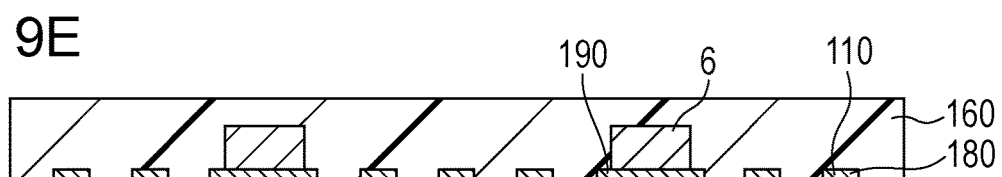

Next, as depicted in FIG. 9E, the temporarily fixed sheet 14 is detached. At such time, the wiring patterns 110 are exposed due to the temporarily fixed sheet 14 being detached.

(Coating Flexible Member)

Figure 9F:
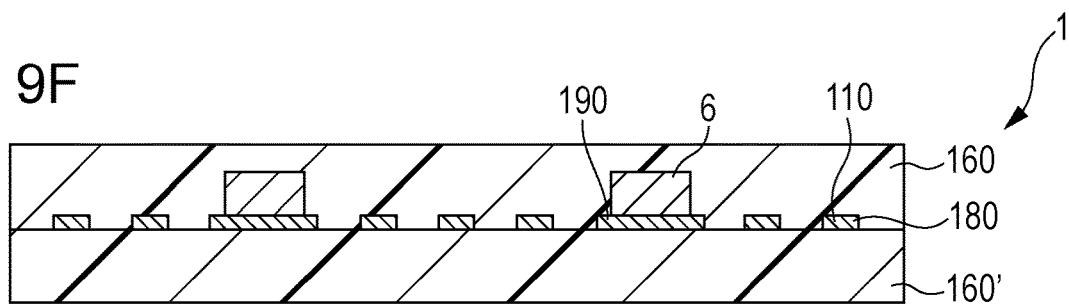

Next, as depicted in FIG. 9F, the exposed wiring patterns 110 are covered with a flexible member 160' such as an elastomer. This flexible member 160' functions as an insulation sheet.

According to the above, the flexible substrate of the present disclosure can be formed.

Heretofore, the flexible substrate of the present disclosure has been described; however, the present disclosure is not limited thereto, and it is to be understood that various alterations may be implemented by a person skilled in the art without deviating from the scope of the present disclosure defined by the scope of the patent claims hereinafter.

A flexible substrate according to an embodiment of the present disclosure comprises a plurality of unit wiring structures. Each of the plurality of unit wiring structures comprises a central section and one or a plurality of strips disposed at an outer side of the central section. Each of the one or plurality of strips has a first end and a second end, is curved, and includes wiring. The first end is connected to the central section. The plurality of unit wiring structures include a first unit wiring structure and a second unit wiring structure that are mutually adjacent. The second end of at least one of the one or plurality of strips of the first unit wiring structure and the second end of at least one of the one or plurality of strips of the second unit wiring structure are mutually connected. The flexible substrate includes a gap between a side surface of the mutually connected strips and a side surface of the central section of the first or the second unit wiring structure, and/or between a side surface of the mutually connected strips and a side surface of another strip, and is extensible in a planar direction and a perpendicular direction of the flexible substrate due to curvatures of curves of the mutually connected strips changing.

In each of the plurality of unit wiring structures, the one or plurality of strips may be disposed along an outer periphery of at least part of the central section.

The one or plurality of strips in each of the plurality of unit wiring structures may be a plurality of strips.

The plurality of strips in each of the plurality of unit wiring structures may curve in a clockwise or a counter-clockwise manner with the central section as a center of rotation.

An inflection point may be present at a point where the mutually connected strips connect.

The plurality of unit wiring structures may further include a third unit wiring structure that is adjacent to the second unit wiring structure. The first to the third unit wiring structures may be arranged in one direction. The second end of at least one of the plurality of strips of the second unit wiring structure and the second end of the at least one of the plurality of strips of the third unit wiring structure may be mutually connected.

The plurality of unit wiring structures may further include third and fourth unit wiring structures that are mutually adjacent. The plurality of strips in each of the first to fourth unit wiring structures may be at least three strips. The third unit wiring structure may be arranged adjacent to the first unit wiring structure in a second direction that intersects a first direction in which the first and second unit wiring structures are arranged. The fourth unit wiring structure may be arranged adjacent to the second unit wiring structure in the second direction. Between adjacent unit wiring structures from among the first to fourth unit wiring structures, the second end of at least one of the at least three strips of one unit wiring structure and the second end of at least one of the at least three strips of the other unit wiring structure may be mutually connected.

The plurality of unit wiring structures may include at least four unit wiring structures including the first and second unit wiring structures. The at least four unit wiring structures may be arranged in a two-dimensional manner. Between adjacent unit wiring structures from among the at least four unit wiring structures, the second end of at least one of the plurality of strips of one unit wiring structure and the second end of at least one of the plurality of strips of the other unit wiring structure may be mutually connected.

In each of the plurality of unit wiring structures, the central section may be substantially circular.

Prior to extension or contraction, a center of the central section and a curve center of the one or plurality of strips may be substantially aligned in each of the plurality of unit wiring structures.

In each of the plurality of unit wiring structures, the plurality of strips may be arranged in a symmetrical manner with respect to a center of the central section.

In each of the plurality of unit wiring structures, a curve central angle of the one or plurality of strips may be 60 degrees or greater.

In each of the plurality of unit wiring structures, a curve central angle of the one or plurality of strips may be 360 degrees or greater.

In each of the plurality of unit wiring structures, the one or plurality of strips may be provided wound around the central section two or more times.

The flexible substrate may further comprise one or a plurality of electronic elements each disposed on the central section of a corresponding one of the plurality of unit wiring structures.

The flexible substrate of the present disclosure is not limited to the category of the field of typical electronic devices and is able to be used also in the field of wearable devices, the health care field, the medical field, and the nursing field. For example, in an electronic device in which extension/contraction or flexible deformation that follows the movement of a human body or the like is required such as a wearable device, the flexible substrate of the present disclosure can be used as a wiring substrate that connects circuit modules and exhibits a high degree of elasticity.

What is claimed is:

1. A display comprising:
    a flexible substrate including a plurality of unit wiring structures and an insulation sheet on which the plurality of unit wiring structures are disposed, wherein
        each of the plurality of unit wiring structures comprises a central section and a plurality of strips disposed at an outer side of the central section,
        each of the plurality of strips has a first end and a second end, and is curved along an outer periphery of at least part of the central section, the first end connected to the central section,
        the plurality of strips in each of the plurality of unit wiring structures curve in a clockwise or a counter-clockwise manner with the central section as a center of rotation,
        the plurality of unit wiring structures include at least four unit wiring structures arranged in a two-dimensional manner,
        between adjacent unit wiring structures from among the at least four unit wiring structures, the second end of at least one of the plurality of strips of one unit wiring structure and the second end of at least one of the plurality of strips of the other unit wiring structure are mutually connected,
        the plurality of unit wiring structures, in a plan view, include a gap between the mutually connected strips and the central section, and/or between the mutually connected strips and another strip, and is configured to extend and contract in a planar direction and a perpendicular direction of the flexible substrate due to curvatures of curves of the mutually connected strips changing, and
        the insulation sheet, in a plan view, includes a gap between the mutually connected strips and the central section, and/or between the mutually connected strips and another strip,
    light emitting elements each disposed on the central section of a corresponding one of the plurality of unit wiring structures, and
    a controller configured to drive the light emitting elements for display.
2. The display according to claim 1, wherein an inflection point is present at a point where the mutually connected strips connect.
3. The display according to claim 1, wherein in each of the plurality of unit wiring structures, the central section is substantially circular.
4. The display according to claim 1, wherein the insulation sheet is formed from at least one kind of material selected from the group consisting of polyethylene terephthalate (PET), polyethylene naphthalate (PEN), polyether ether ketone (PEEK), polyimide (PI), and a liquid crystal polymer.
5. The display according to claim 1, wherein the gap in the plurality of unit wiring structures is larger than the gap in the insulation sheet.
6. The display according to claim 1, wherein the insulation sheet has a first surface and a second surface, and the plurality of unit wiring structures are formed on the first surface and the second surface.
7. The display according to claim 6, wherein the plurality of unit wiring structures on the first surface and the second surface is connected by a connection via through the insulation sheet.
8. The display according to claim 7, wherein the connection via is formed through the central section.
9. The display according to claim 1, wherein the flexible substrate is covered with a flexible member, the flexible member being an elastomer.
10. The display according to claim 1, wherein the light emitting elements are RGB tri-color LED elements.
11. The display according to claim 10, wherein the controller controls the RGB tri-color LED elements for a full-color display.
12. The display according to claim 11, wherein the controller sends control data to the RGB tri-color LED elements by way of the strips.
13. The display according to claim 12, wherein the controller is electrically connected to a row driver for driving the light emitting elements in a row direction and is electrically connected to a column driver for driving the light emitting elements in a column direction.

* * * * *